United States Patent
Lamorey et al.

(10) Patent No.: US 7,660,152 B2
(45) Date of Patent: Feb. 9, 2010

(54) METHOD AND APPARATUS FOR IMPLEMENTING SELF-REFERENCING READ OPERATION FOR PCRAM DEVICES

(75) Inventors: Mark C. Lamorey, South Burlington, VT (US); Thomas M. Maffitt, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 12/112,454

(22) Filed: Apr. 30, 2008

(65) Prior Publication Data

US 2009/0273968 A1 Nov. 5, 2009

(51) Int. Cl.
*G11C 11/00* (2006.01)

(52) U.S. Cl. ...................... 365/163; 365/113
(58) Field of Classification Search .......... 365/113, 365/163, 185.28
See application file for complete search history.

(56) References Cited

U.S. PATENT DOCUMENTS

| | | | |
|---|---|---|---|
| 6,590,807 B2 | 7/2003 | Lowrey | |
| 7,042,760 B2 | 5/2006 | Hwang et al. | |
| 2005/0047193 A1 | 3/2005 | Bedeschi et al. | |
| 2006/0146600 A1 | 7/2006 | Johnson | |
| 2006/0164898 A1* | 7/2006 | Pio | 365/210 |
| 2006/0227592 A1 | 10/2006 | Parkinson et al. | |
| 2006/0233019 A1 | 10/2006 | Kostylev et al. | |

* cited by examiner

*Primary Examiner*—Huan Hoang
*Assistant Examiner*—Jason Lappas
(74) *Attorney, Agent, or Firm*—Cantor Colburn LLP; Michael LeStrange (57) ABSTRACT

A method of implementing a self-referencing read operation for a PCRAM array includes applying a stimulus to a bit line associated with a selected phase change element (PCE) to be read; comparing a first voltage on a node of the bit line with a second voltage on a delay node, wherein the second voltage represents a delayed voltage with respect to the first voltage due to a resistance/capacitance time constant associated therewith; and determining whether, during the read operation, the first voltage drops below the value of the second voltage; wherein in the event the first voltage drops below the value of the second voltage during the read operation, the PCE is determined to be programmed to an amorphous state and in the event the first voltage does not drop below the value of the second voltage, the PCE is determined to be programmed to a crystalline state.

20 Claims, 6 Drawing Sheets

METHOD AND APPARATUS FOR IMPLEMENTING SELF-REFERENCING READ OPERATION FOR PCRAM DEVICES

BACKGROUND

The present invention relates generally to integrated circuit memory devices and, more particularly, to a method and apparatus for implementing a self-referencing read operation for phase-change random access memory (PCRAM) devices.

Dynamic Random Access Memory (DRAM) integrated circuit arrays have been existence for several years, with their dramatic increase in storage capacity having been achieved through advances in semiconductor fabrication technology and circuit design technology. The considerable advances in these two technologies have also resulted in higher and higher levels of integration that permit dramatic reductions in memory array size and cost, as well as increased process yield.

A DRAM memory cell typically includes, as basic components, an access transistor (switch) and a capacitor for storing a binary data bit in the form of a charge. Typically, a first voltage is stored on the capacitor to represent a logic HIGH or binary "1" value (e.g., $V_{DD}$), while a second voltage on the storage capacitor represents a logic LOW or binary "0" value (e.g., ground). A basic drawback of a DRAM device is that the charge on the capacitor eventually leaks away and therefore provisions must be made to "refresh" the capacitor charge, otherwise the data bit stored by the memory cell is lost.

The memory cell of a conventional Static Random Access Memory (SRAM), on the other hand, includes, as basic components, an access transistor or transistors and a memory element in the form of two or more integrated circuit devices interconnected to function as a bistable latch. An example of such a bistable latch is a pair of cross-coupled inverters. Bistable latches do not need to be "refreshed," as in the case of DRAM memory cells, and will reliably store a data bit indefinitely so long as they continue to receive supply voltage. However, such a memory cell requires a larger number of transistors and therefore a larger amount of silicon real estate than a simple DRAM cell, and draws more power than a DRAM cell. Like a DRAM array, an SRAM array is also a form of volatile memory in that the data is lost once power is removed.

Accordingly, efforts continue to identify other types of memory elements that are capable of storing data states, that do not require extensive refreshing, and that are non-volatile in nature. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout voltage supplying a current switched through the resistive memory element by an access device, thus indicating the stable resistance state it had previously been programmed to.

Phase Change Random Access Memory ("PCRAM" also referred to as "PRAM") is an emerging non-volatile memory technology which stores data using phase change materials (such as Ge—Sb—Te (GST) alloys) having a programmable electrical resistance that changes with temperature. Other compositions such as $GeSb_4$, (including substitution/addition of other elements) are also possible for the phase change materials. Individual phase change elements (PCE) are thus used as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state. Essentially, there is no practical limit to the number of times a PCE element may be programmed from the crystalline state to the amorphous state and vice versa.

The changing of the phase of a PCE typically requires a high temperature (e.g., above 200° C. to 900° C. depending on material properties), as can be obtained by Joule heating from current flowing through the phase change material or discrete resistor. When the phase change material is heated above its melting temperature to thereafter be quickly cooled, the phase change material becomes amorphous to store a data bit of "1." Alternatively, when the phase change material is heated above its crystallization temperature and maintained at that temperature for a predetermined time before cooling, the phase change material becomes crystalline to store a data bit of "0."

Figure 1:
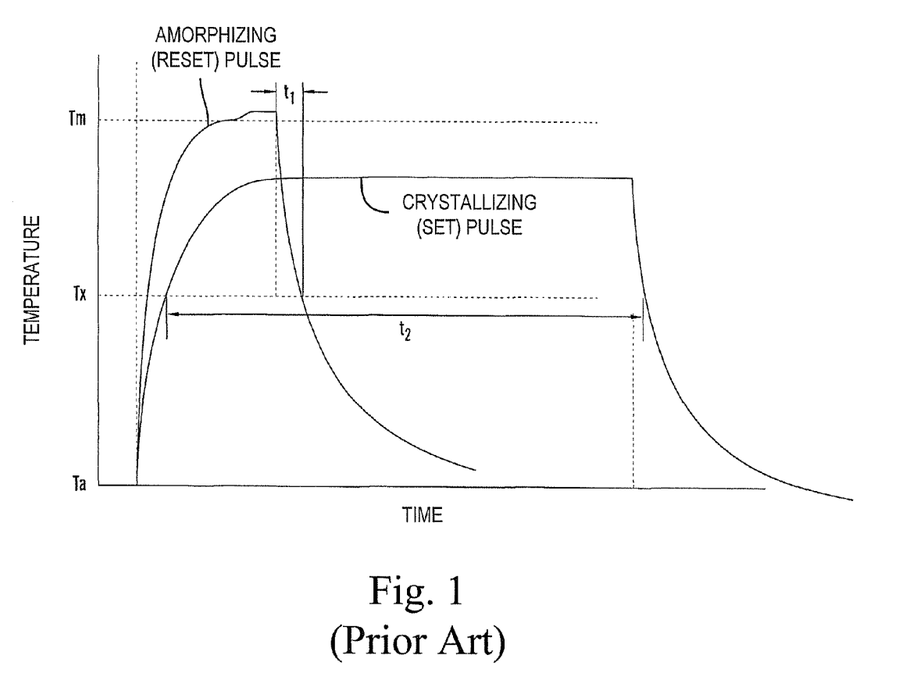
FIG. 1 is a graph illustrating the exemplary thermal cycling operations of a phase change material used as a PCE storage cell.

More specifically, FIG. 1 is a graph illustrating the exemplary thermal cycling operations of a phase change material used as a PCE storage cell. As is illustrated, a first thermal cycling operation includes a "RESET" pulse for converting the PCE from crystalline to amorphous form, and a second thermal cycling operation includes a "SET" pulse for converting the PCE from amorphous to crystalline form. During the RESET pulse, the temperature of the PCM is raised above its melting temperature ($T_m$), followed by a rapid quench over a short time $t_1$. As a result of the rapid quench, the disordered arrangement of atoms of the PCM due to the melt is retained. Thus, the PCM is left in an amorphous, high resistive state after the RESET pulse. During the SET pulse, the PCM is annealed at a lower temperature with respect to the melting temperature, and for a longer time $t_2$ with respect to $t_1$. This process enables the amorphous form to crystallize into a lower resistive state.

A key aspect to the feasibility of PCM memory technology is the ability to design large-scale arrays so as to allow random access of millions of bits. This may be done, for example through an array of PCEs, each gated by associated access transistors using a matrix of word lines (WL) (e.g., formed from a polysilicon gate material) and bit lines (BL) (e.g., formed with metal interconnect material). The current passing through the PCE may be controlled via the bit line (BL) and/or word line (WL). However, due to the parasitic capacitance of the bit lines, resistance variations in the bit lines, variations in the access transistors, and other process variations, the cell current (and thus power) used in the writing process can have variations, thus leading to a distribution of resistance values for both low and high resistance states.

Further complicating the matter of design is the operating temperature range of the chip. For example, if one PCE cell is written when the ambient temperature is -25° C. and another cell is written when the ambient temperature is +85° C., the resulting resistances for the same logic state may be significantly different from one another. Conversely, the resistances for opposite states may actually be substantially close in value to one another. Even with the use of temperature compensation circuits for both write and read operations, the apparent distributions will broaden and the signal margin will shrink.

Historically, the reading of a PCE memory cell is implemented by applying either a current or voltage and measuring a resulting voltage or current respectively, and then comparing the measured current/voltage against a known reference value. The known reference value may be digitally set or generated on chip through averaging a low and high value, or multiplying a low or high value by a factor. Regardless, each of these techniques is fundamentally the same, in that a signal by the cell to be read is compared to a fixed reference level. Again, if the temperature or processing conditions vary such that there is a large variation in the cell resistance values for both crystalline amorphous states, it becomes difficult to ensure a single fixed reference value is appropriate for proper cell state detection.

One way to avoid the use of a single reference level is to utilize the so-called "twin cell" design, in which two PCE devices per bit are used. One of the cells is written low and the other high, depending on the logical state. During a compare, if cell A is high and B is low then the output of a sense amplifier (and hence the logical state of the cell) is a 1, and conversely if A is low and B is high then the sense amplifier output is a 0. While this alleviates the need of having one reference fit level fit all the bits, it comes at the cost of the array efficiency (using two PCEs per bit) to be roughly half that of a non twin cell chip. Accordingly, it would be desirable to be able to implement a more improved, robust PCE read technique in a manner that does not adversely impact the array efficiency.

SUMMARY

The foregoing discussed drawbacks and deficiencies of the prior art are overcome or alleviated, in an exemplary embodiment, by a method of implementing a self-referencing read operation for a phase change random access memory (PCRAM) array, including applying a stimulus to a bit line associated with a selected phase change element (PCE) to be read; comparing a first voltage on a node of the bit line with a second voltage on a delay node, wherein the second voltage on the delay node represents a delayed voltage with respect to the first voltage due to a resistance/capacitance time constant associated therewith; and determining whether, during the read operation, the first voltage drops below the value of the second voltage; wherein in the event the first voltage drops below the value of the second voltage during the read operation, the PCE is determined to be programmed to an amorphous state and in the event the first voltage does not drop below the value of the second voltage during the read operation, the PCE is determined to be programmed to a crystalline state.

In another embodiment, an apparatus for implementing a self-referencing read operation for a phase change random access memory (PCRAM) array includes a device for applying a stimulus to a bit line associated with a selected phase change element (PCE) to be read; and a comparator for comparing a first voltage on a node of the bit line with a second voltage on a delay node, wherein the second voltage on the delay node represents a delayed voltage with respect to the first voltage due to a resistance/capacitance time constant associated therewith, the comparator configured to determine whether, during the read operation, the first voltage drops below the value of the second voltage; wherein in the event the first voltage drops below the value of the second voltage during the read operation, the PCE is determined to be programmed to an amorphous state and in the event the first voltage does not drop below the value of the second voltage during the read operation, the PCE is determined to be programmed to a crystalline state.

BRIEF DESCRIPTION OF THE DRAWINGS

Referring to the exemplary drawings wherein like elements are numbered alike in the several Figures.

DETAILED DESCRIPTION

Disclosed herein is a method and apparatus for implementing a self-referencing read operation for phase-change random access memory (PCRAM) devices. Briefly stated, the embodiments herein check for a resistance breakdown condition that is characteristic of the amorphous state only (not the crystalline state) by comparing the value of the bit line node voltage against a slightly delayed value of the bit line node value. If the PCE is in the crystalline state, then the voltage difference between these nodes will be substantially continuous over an increasing value of applied current through the PCE. That is, the value of the bit line node voltage will always be higher than that of the delayed bit line node voltage.

On the other hand, if the PCE is in the amorphous state, then the PCE will at some point breakdown with an increasing amount of read current/voltage applied thereto. Specifically, this breakdown will occur when the voltage across the PCE is greater than the breakdown voltage ($V_b$) that is characteristic of an amorphous state PCE. Once this happens, the voltage on the bit line node will suddenly drop as the amorphous PCE resistance switches from, for example, about 100 KΩ to about 1KΩ. Using this example, the bit line which had been charged up to $V_b$ will now suddenly discharge to about $\frac{1}{100} V_b$. More significantly, this discharge will first occur on the bit line, and then followed by the voltage on the delayed bit line node. For a brief period of time (e.g., 0.5 ns-5 ns) the voltage on the bit line node will therefore be lower in magnitude than the voltage on the delayed bit line node. Thus, the state of a compare mechanism for the bit line and delayed bit line voltages (e.g., a sense amplifier) will be able to detect and latch this transition, which indicates the cell is in the amorphous state. Again, if the sense amplifier does not detect such a transition due to a resistance breakdown, then it becomes known that the cell was in the crystalline state. As described in further detail herein, one way to produce the self-referencing delayed bit line node is through an appropriate RC network coupled to the bit line associated with the PCE.

Figure 2:
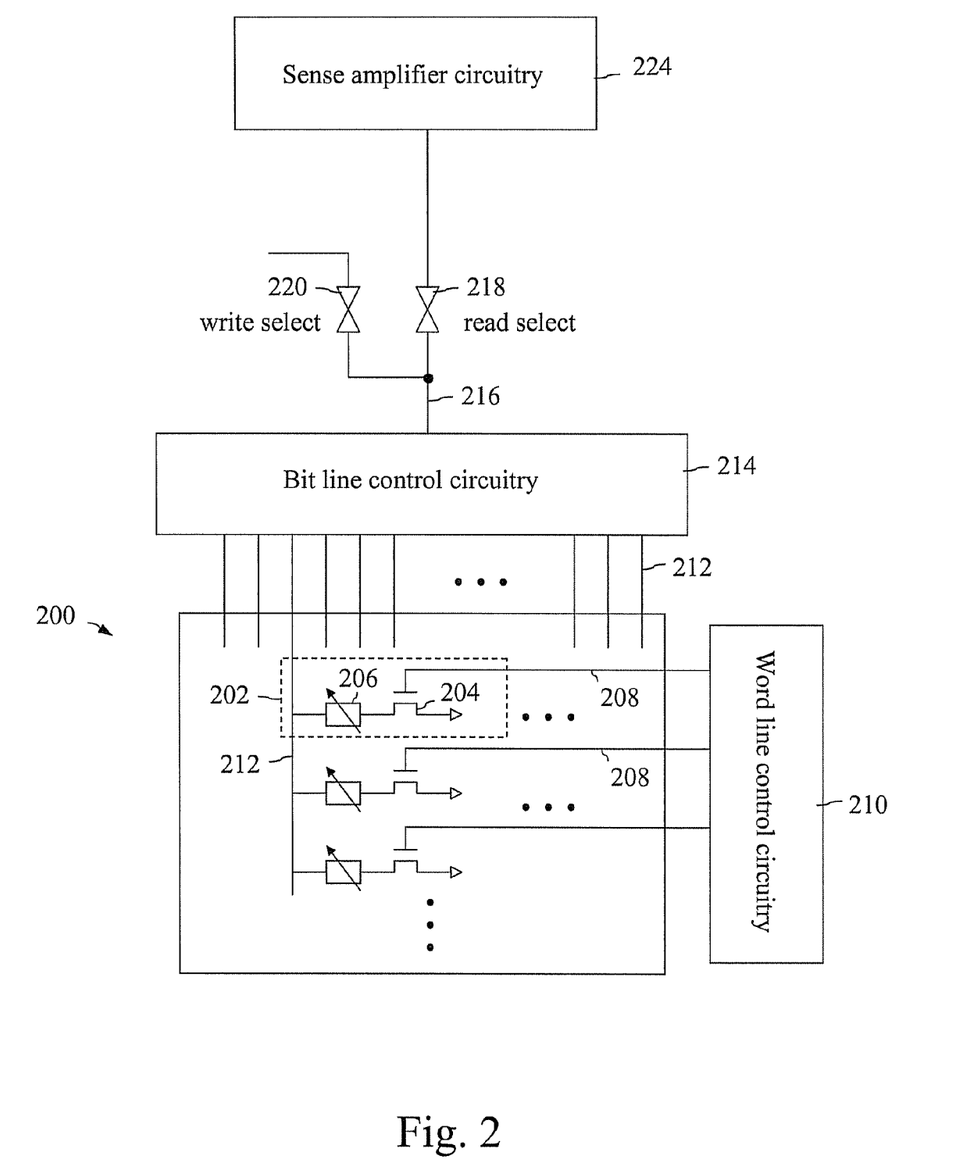
FIG. 2 is a schematic diagram of an exemplary PCRAM array suitable for use in accordance with an embodiment of the invention.

Referring now to FIG. 2, there is shown a schematic diagram of an exemplary PCRAM array 200 suitable for use in accordance with an embodiment of the invention. As is shown, the array 200 includes a plurality of individual memory cells 202, each having an access transistor 204 and a programmable PCE 206 (e.g., such as a GST element described above). The individual cells 202 are arranged into rows and columns, with the gate terminal of each access transistor 204 coupled to one of a plurality of word lines 208 that are coupled to word line control circuitry 210 as known in the art. Further, when activated, each access transistor 204 couples its corresponding PCE 206 to an associated bit (data) line 212, which are coupled to bit line control circuitry 214 (e.g., sense amplifiers, row address decoders, etc.) as also known in the art. The bit line control circuitry couples an accessed bit line (pair) to a master bit line (pair) 216, which is in communication with both read select circuitry 218 and write select circuitry 220. As the write circuitry is not a focus of the present disclosure, a detailed discussion of the same is not presented herein.

Figure 3:
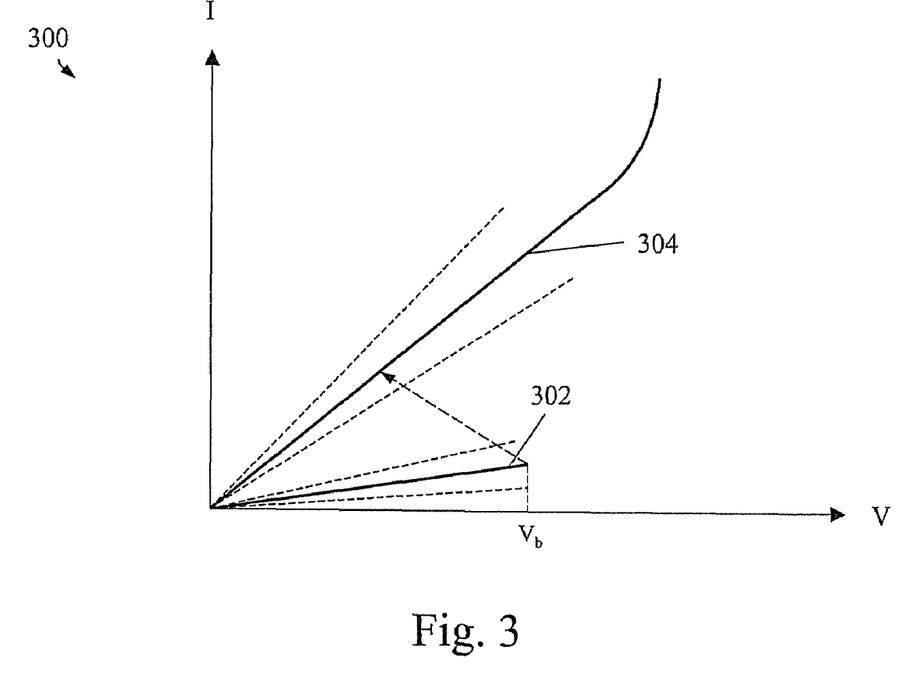
FIG. 3 is a graph depicting the resistance characteristics of a PCE cell in the lower resistance crystalline state and the higher resistance amorphous state, as a function of voltage applied thereto.

Referring to FIG. 3, there is shown a graph 300 depicting the IV characteristics of a PCE. Curve 302 represents the high resistance of the amorphous state while curve 304 represents the low resistance of the crystalline state. It will be noted that the dashed lines adjacent both curves represent a range or distribution of possible resistance curves for that state, based on variations in certain processing, programming or temperature conditions, for example. It will further be noted from FIG. 3 that the high resistance curve 304 only extends up to a breakdown voltage ($V_b$), above which the characteristic resistance curve "snaps back" and mimics that of the crystalline state, as indicated by the dashed arrow. However, this electrical breakdown does not actually alter the crystal state of the PCE.

Figure 4:
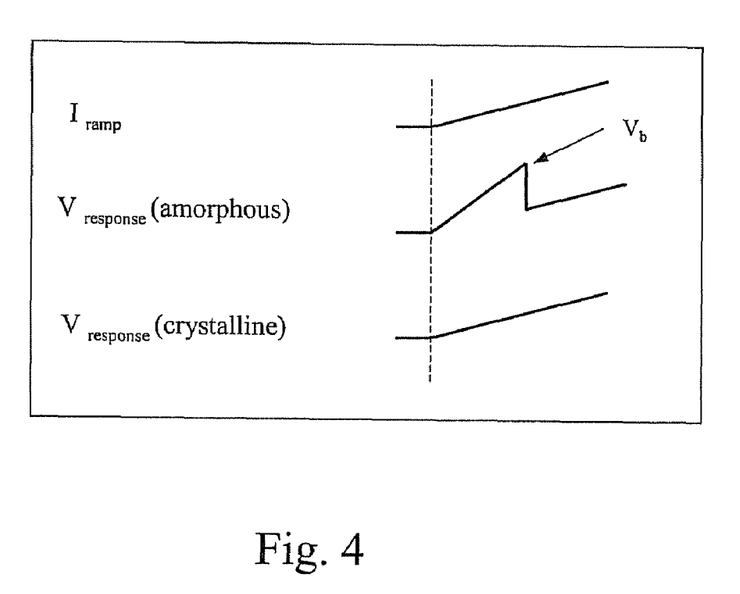
FIG. 4 is another graph illustrating, for an applied ramping current, the resulting voltage response across the PCE cell in both the amorphous and crystalline states.

FIG. 4 is another graph 400 illustrating, for an applied ramping current, the resulting voltage response across the PCE cell for both the amorphous and crystalline states. Whereas the voltage across a crystalline phase PCE smoothly tracks the value of the ramp current, it will be seen that for an amorphous phase PCE there eventually comes a point at which the ramping current causes the voltage across the PCE to reach the breakdown voltage. At this point, the voltage across the PCE suddenly decreases (as the PCE resistance drops), before steadily increasing with higher ramping current again. Regardless of the specific value of this breakdown voltage in the amorphous state, if the breakdown itself can be detected with an applied ramp current, the cell can be read to determine whether it is amorphous or crystalline. That is, if the breakdown point is detected, the PCE is programmed to the amorphous state; if not, the PCE is programmed to the crystalline state.

Figure 5:
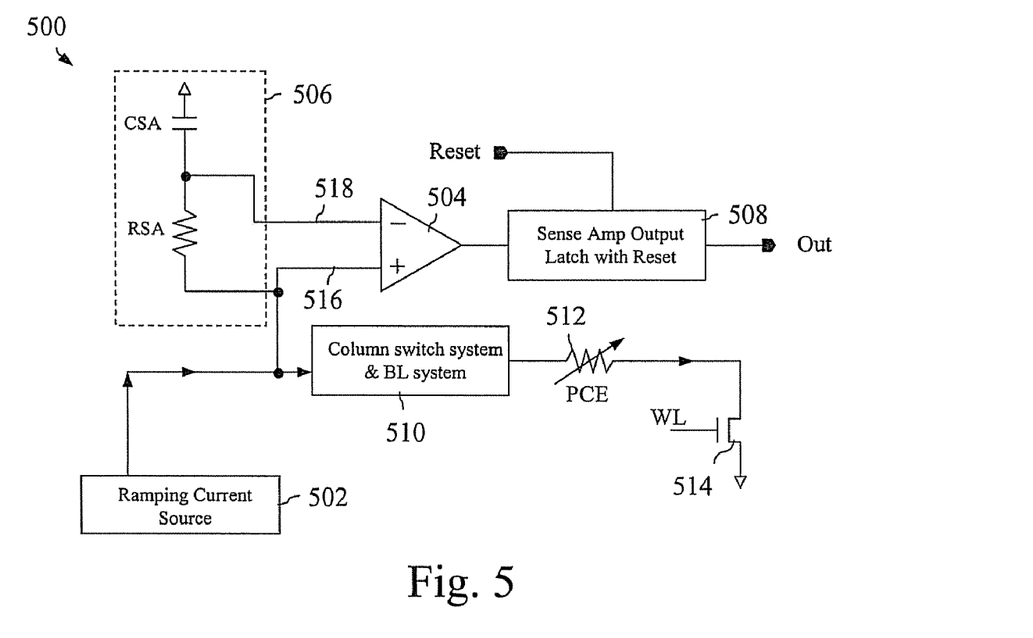
FIG. 5 is a schematic diagram illustrating an apparatus for implementing a self-referencing read operation for PCRAM devices, in accordance with an embodiment of the invention.

Accordingly, FIG. 5 is a schematic diagram illustrating an apparatus 500 for implementing a self-referencing read operation for PCRAM devices, in accordance with an embodiment of the invention. As is shown, the apparatus 500 includes a ramping current source 502, a sense amplifier (op-amp) 504, a sense amp delay block 506, a data latch 508, and a column switch and bit line system 510 with a selected PCE 512 through an associated access FET 514. In FIG. 5, the column switch and bit line system 510 has been simplified in order to show the operating point where one word line (WL) and one bit line (BL) have been selected and the system is going to sense the state of a PCE.

One of the inputs (+) of the sense amplifier 504 is coupled to the bit line node 516 associated with the PCE 512 to be read when selected through FET 514. The other input (−) of the sense amplifier 504 is coupled to a delayed version of the bit line node 516, also referred to herein as the delay node 518. This delay is achieved through the selection of suitable (RC) values of resistance and capacitance of the delay block 506, which includes resistor RSA and capacitor CSA. Thus, a change in voltage on bit line node 516 results in a delayed change in the voltage on the delay node 518. By comparing the values of the voltages on the bit line node 516 and the delay node 518, it is thus possible to detect a point at which the voltage of the bit line node 516 dips below the value of the voltage of the delay node 518. If this happens, such a change in the output of the sense amplifier 504 may be stored in the data latch 508, which reflects reading the PCE in the amorphous state. It will be appreciated that the polarity of the inputs to the sense amplifier 504 can be reversed (i.e., the bit line node 516 coupled to "−" and the delay node 518 coupled to "+"), so long as the output data latch 508 is configured to detect a change in state (e.g., a normally high output of the sense amplifier 504 briefly transitioning to low, or a normally low output of the sense amplifier briefly transitioning to high).

In the embodiment depicted, the RC elements (i.e., RSA, CSA) of the delay block 506 may be discrete components. As described below, however, the capacitance component (CSA) may be utilized from an existing structure, such as a bit line from an unaccessed, adjacent array of the device.

Figure 6:
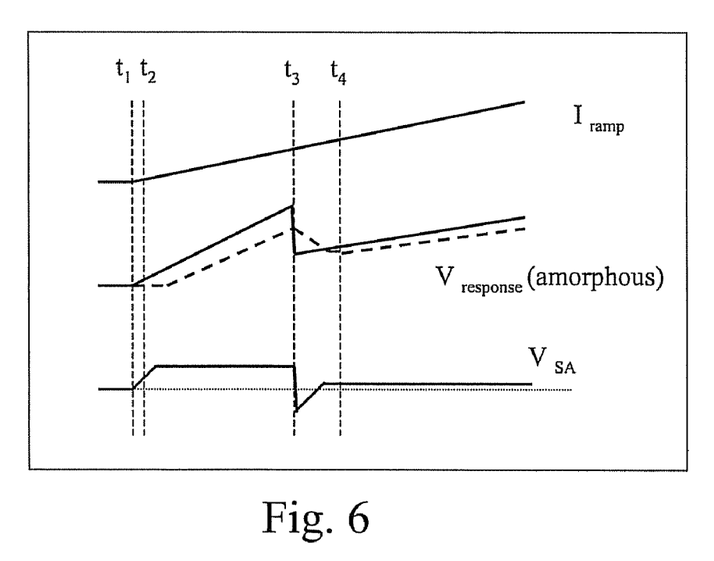
FIG. 6 is a graph illustrating, for an applied ramping current, the resulting voltage response at bit line and delayed bit line nodes of the apparatus of FIG. 5.

FIG. 6 is a graph illustrating, for an applied ramping current, the resulting voltage response at bit line and delayed bit line nodes of the apparatus of FIG. 5, when the PCE is programmed to the amorphous state. At time $t_1$, the ramping current source 502 is activated so as to cause read current to flow through the PCE 512, with the PCE 512 being selected for a read operation through word line activation of FET 514. As the magnitude of the current is increased the voltage across the PCE 512 increases, thus increasing the voltage on the bit line node 516. Due to the presence of RSA and CSA within the delay block 506, a corresponding increase in voltage occurs at the delay node 518, but delayed with respect to bit line node 516. The bit line node voltage curve is depicted by solid line 602 in FIG. 6, while the delay node voltage curve is depicted by dashed line 604 in FIG. 6. Because there is initially no voltage differential across the sense amplifier inputs prior to a read operation, the output data latch 508 is initially held inactive for a very small amount of time until there is a difference (delay) in voltage established across the sense amplifier inputs after ramping current activation. Thus, at time $t_2$, the output latch 508 is activated, at which time it can be seen from FIG. 6 that a differential in voltage is established between the bit line node 516 and the delay node 518.

Between times $t_2$ and $t_3$, it will be seen that the increasing delay node voltage remains less than the increasing bit line node voltage due to the delay block resistance and capacitance. However, at time $t_3$, the ramping current now causes the PCE voltage to reach its amorphous breakdown value, thereby causing the voltage on the bit line node 516 to suddenly drop. Due to the delay block, the voltage on the delay node 518 does not immediately follow this drop and, as a result, there is a window of time (between $t_3$ and $t_4$) during which the delay node voltage exceeds the bit line node voltage. This in turn results in a corresponding change in the output voltage of the sense amplifier ($V_{SA}$). Following time $t_4$, the PCE now exhibits similar electrical characteristics similar to that of the crystalline phase, and the delay node voltage once again lags behind the bit line node voltage. Again, however, the breakdown condition was detected and captured by the sense amplifier/latch combination to indicate the PCE in the amorphous state.

As indicated above, in an effort to optimize the array efficiency it is contemplated that the capacitive component (CSA) of the delay block 506, instead of a discrete capacitor added to the array design, may represent an unselected bit line from an array. This is advantageous in that (1) no additional area is taken away from the array by a discrete CSA element, and (2) the capacitance of CSA will track very closely to the capacitance of the selected bit line associated with the PCE cell that is being sensed. For example, in FIG. 7, the cells present in array portion 702 are sensed by centrally located sense amplifier circuitry 704. Accordingly, the capacitance component of the delay block used in the self-referencing circuitry could be taken from an unselected bit line in array portion 706, which is also located adjacent to the sense amplifier circuitry. An alternative embodiment of the resulting sensing apparatus is presented in FIG. 8.

Figure 7:
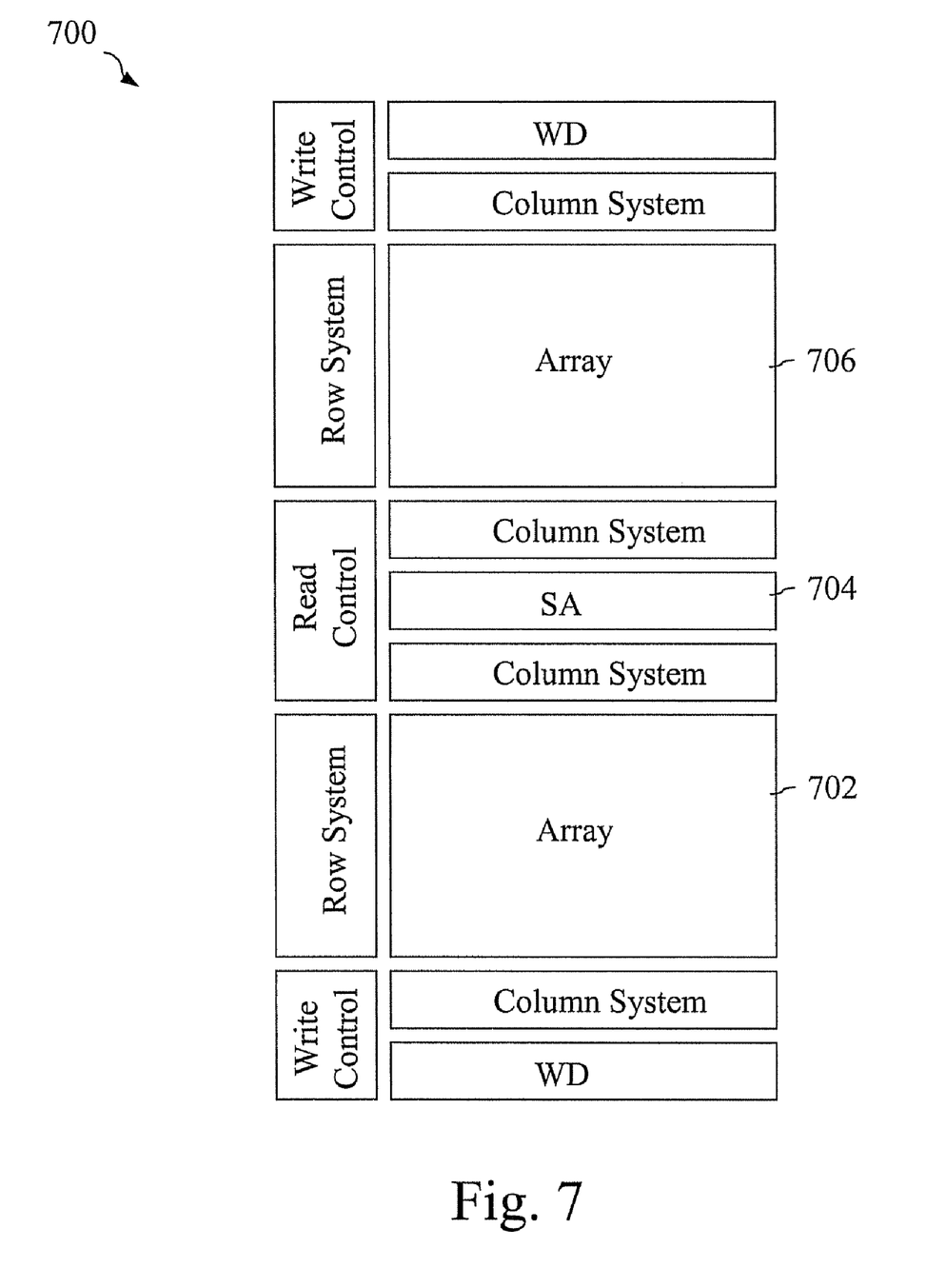
FIG. 7 is a schematic block diagram illustrating the layout of a PCRAM system that may incorporate a self-referencing read apparatus.
Figure 8:
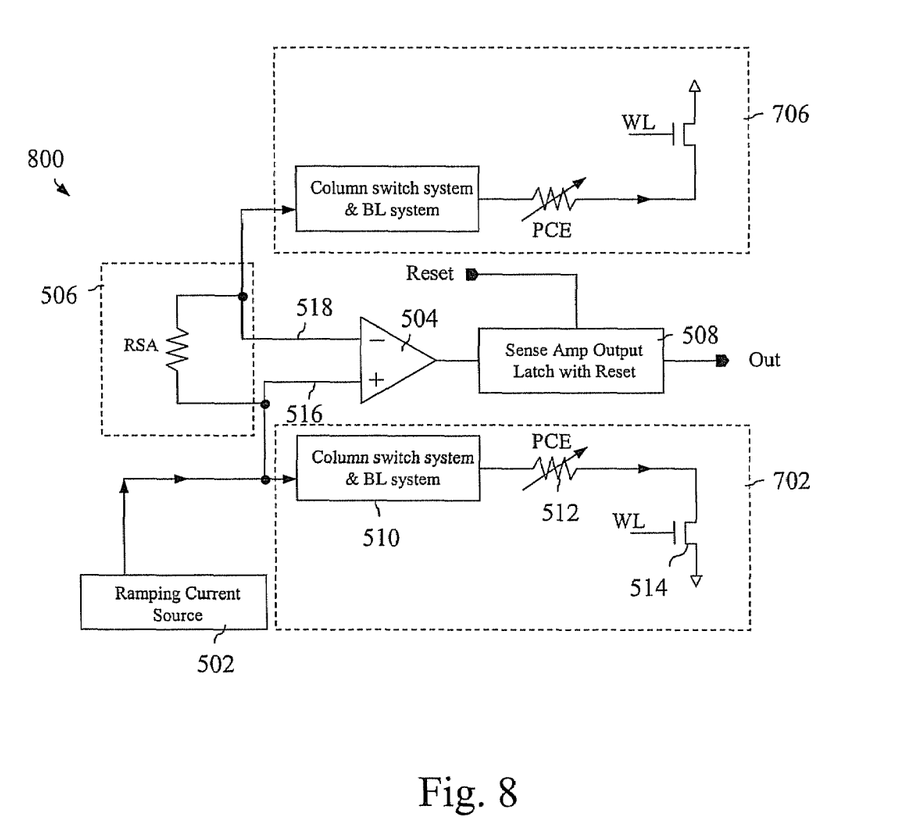
FIG. 8 is a schematic diagram illustrating an apparatus for implementing a self-referencing read operation for PCRAM devices, in accordance with an alternative embodiment of the invention.

As shown in FIG. 8, the discrete capacitor CSA from FIG. 5 is replaced by another unselected bit line system from adjacent array portion 706. Along with RSA in delay block 506, the capacitance from the unselected bit line provides an appropriate signal delay on delay node 518 so that the sense amplifier 504 can detect whether the PCE 512 to be read is in the amorphous state or not. Again, by using the adjacent array portion 706, the capacitance of the unselected bit line will track very closely to the capacitance of the selected bit line associated with the PCE cell that is being sensed.

Design Considerations

Simulations support the functionality of the above-described self-referencing sense amplifier with values of RSA close to $R_{low}$ (PCE resistance in crystalline state) and $R_{high}$ (PCE resistance in amorphous state). These values may be above or below the $R_{high}$ and $R_{low}$ values, respectively, up to a certain margin. In a further effort to provide increased tracking of the sense amplifier system to the PCE array, it is contemplated that the RSA element itself may also be formed from PCEs. In such a case, the RSA should be made up from PCEs in the low resistance state, since the crystalline state represents the more stable resistance value. For example, if the value of RSA is selected to be $2*R_{low}$, then two crystalline PCEs in connected series may be used for RSA. Furthermore, the RSA may also take into effect some averaging of PCE resistance to account for process variations such that, for example, two legs in parallel for a total of four PCE elements are used (or 4 parallel legs of 8 total PCE elements). This averaging of PCE resistances may be done in almost any organization and is limited only by the area that the chain of PCEs will take up. However given the area of the sense amplifier, any array size of PCE resistances should be negligible.

With respect to the ramping current source, the ramp rate of the current should be such that it is slower than the charge/discharge time of the bit line system such that the transition condition where (for the amorphous state) the voltage on the bit line node temporarily drops below the voltage on the delay node may be detected. Thus, in an exemplary embodiment, the RC time constant of the delay block 506 is chosen to be substantially equal to the RC time constant of the bit line and the (amorphous) PCE being read.

In lieu of the current ramping source 502, a current switch or pulse could be used. In still another alternative example, a ramping voltage source can also be used, while the detection circuitry looks for a discontinuity with an integrating sense amp. In any case, the design of the stimulus and sense control system should be optimized to ensure the read is non-destructive, by not annealing a reset (amorphous) bit. However, in the case of the bit being in the crystalline (set) state, it could be considered acceptable to anneal the bit more. This is of more of a concern where a voltage stimulus is being used.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing a self-referencing read operation for a phase change random access memory (PCRAM) array, the method comprising:
    applying a stimulus to a bit line associated with a selected phase change element (PCE) to be read;
    comparing a first voltage on a node of the bit line with a second voltage on a delay node, wherein the second voltage on the delay node represents a delayed voltage with respect to the first voltage due to a resistance/capacitance time constant associated therewith; and
    determining whether, during the read operation, the first voltage drops below the value of the second voltage;
    wherein in the event the first voltage drops below the value of the second voltage during the read operation, the PCE is determined to be programmed to an amorphous state and in the event the first voltage does not drop below the value of the second voltage during the read operation, the PCE is determined to be programmed to a crystalline state.

2. The method of claim 1, wherein the applying the stimulus to the bit line associated with the PCE to be read comprises activating a ramping current source that creates an increase in the voltage across the PCE.

3. The method of claim 2, wherein for a condition where the PCE is programmed to the amorphous state, the dropping of the first voltage below the value of the second voltage corresponds to a voltage breakdown of the amorphous state PCE such that the electrical resistance thereof decreases.

4. The method of claim 1, wherein the delay node and the bit line node are coupled to a sense amplifier.

5. The method of claim 4, further comprising capturing a change in the output of the sense amplifier in a data latch, which corresponds to reading the PCE in the amorphous state.

6. The method of claim 4, wherein the delay node is coupled to a delay block comprising a resistance element and a capacitive element.

7. The method of claim 6, wherein the capacitive element comprises a discrete component with respect to the PCRAM array.

8. The method of claim 7, wherein the capacitive element comprises an unselected bit line associated with an adjacent array with respect to the array being read.

9. The method of claim 6, wherein the resistive element comprises one or more crystalline state PCEs.

10. The method of claim 6, wherein an RC time constant of the delay block is chosen to be substantially equal to an RC time constant of the bit line and the PCE being read.

11. An apparatus for implementing a self-referencing read operation for a phase change random access memory (PCRAM) array, comprising:

a device for applying a stimulus to a bit line associated with a selected phase change element (PCE) to be read; and a comparator for comparing a first voltage on a node of the bit line with a second voltage on a delay node, wherein the second voltage on the delay node represents a delayed voltage with respect to the first voltage due to a resistance/capacitance time constant associated therewith, the comparator configured to determine whether, during the read operation, the first voltage drops below the value of the second voltage;

wherein in the event the first voltage drops below the value of the second voltage during the read operation, the PCE is determined to be programmed to an amorphous state and in the event the first voltage does not drop below the value of the second voltage during the read operation, the PCE is determined to be programmed to a crystalline state.

12. The apparatus of claim 11, wherein the device for applying the stimulus to the bit line associated with the PCE to be read comprises a ramping current source that creates an increase in the voltage across the PCE.

13. The apparatus of claim 12, wherein for a condition where the PCE is programmed to the amorphous state, the dropping of the first voltage below the value of the second voltage corresponds to a voltage breakdown of the amorphous state PCE such that the electrical resistance thereof decreases.

14. The apparatus of claim 11, wherein the delay node and the bit line node are coupled to a sense amplifier.

15. The apparatus of claim 14, further comprising a data latch configured to capture a change in the output of the sense amplifier, which corresponds to reading the PCE in the amorphous state.

16. The apparatus of claim 14, wherein the delay node is coupled to a delay block comprising a resistance element and a capacitive element.

17. The apparatus of claim 16, wherein the capacitive element comprises a discrete component with respect to the PCRAM array.

18. The apparatus of claim 17, wherein the capacitive element comprises an unselected bit line associated with an adjacent array with respect to the array being read.

19. The apparatus of claim 16, wherein the resistive element comprises one or more crystalline state PCEs.

20. The apparatus of claim 16, wherein an RC time constant of the delay block is chosen to be substantially equal to an RC time constant of the bit line and the PCE being read.

* * * * *